United States Patent
Engel-Herbert et al.

(10) Patent No.: US 10,311,992 B2
(45) Date of Patent: Jun. 4, 2019

(54) TRANSPARENT CONDUCTING FILMS INCLUDING COMPLEX OXIDES

(71) Applicant: The Penn State Research Foundation, University Park, PA (US)

(72) Inventors: Roman Engel-Herbert, University Park, PA (US); Lei Zhang, University Park, PA (US)

(73) Assignee: THE PENN STATE RESEARCH FOUNDATION, University Park, PA (US)

(*) Notice: Subject to any disclaimer, the term of this patent is extended or adjusted under 35 U.S.C. 154(b) by 665 days.

(21) Appl. No.: 14/815,546

(22) Filed: Jul. 31, 2015

(65) Prior Publication Data

US 2016/0180982 A1    Jun. 23, 2016

Related U.S. Application Data

(60) Provisional application No. 62/032,110, filed on Aug. 1, 2014.

(51) Int. Cl.
| | |
|---|---|
| *H01B 1/08* | (2006.01) |
| *C01G 31/02* | (2006.01) |
| *C23C 14/22* | (2006.01) |
| *C23C 14/08* | (2006.01) |
| *C01G 31/00* | (2006.01) |

(52) U.S. Cl.
CPC ............. *H01B 1/08* (2013.01); *C01G 31/006* (2013.01); *C01G 31/02* (2013.01); *C23C 14/08* (2013.01); *C23C 14/22* (2013.01); *C01P 2006/40* (2013.01); *C01P 2006/60* (2013.01)

(58) Field of Classification Search
CPC ........ H01B 1/08; C01G 31/006; C01G 31/02; C23C 14/08; C23C 14/22; C01P 2006/40; C01P 2006/60
See application file for complete search history.

(56) References Cited

U.S. PATENT DOCUMENTS

| 5,516,363 A * | 5/1996 | Azuma ............... C04B 35/4682 106/287.18 |
| 9,659,681 B2 * | 5/2017 | Jung ....................... H01B 1/08 |
| 2007/0269701 A1 | 11/2007 | Larsen et al. |

(Continued)

OTHER PUBLICATIONS

Huber et al., "In situ study of electrochemical activation and surface segregation of the SOFC electrode material La0.75Sr0.25Cr0.5Mn0.5O3+d", Phys. Chem. Chem. Phys., 2012, 14, 751-758.*

(Continued)

*Primary Examiner* — Jonathan C Langman
(74) *Attorney, Agent, or Firm* — Morgan Lewis & Bockius LLP

(57) ABSTRACT

Transparent conducting films including an alkaline earth, transition metal oxide and their optimization of electrical conductivity and optical transparency by aliovalent substitution, which are useful as electrodes for semiconductors and other electronic devices are disclosed. Such materials include thin films of an aliovalent substituted transition metal oxides of Formula (I): $A_{1-x}A'_xB_{1-y}B'_yO_{3-d}$ (I) or a transition metal oxide of Formula (II): $(ABO_{3-d})m(A'B'O_{3-d'})n$.

16 Claims, 8 Drawing Sheets

(56) References Cited

U.S. PATENT DOCUMENTS

2013/0104969 A1* 5/2013 Rappe .................. H01L 31/032
                                                        136/255
2014/0060643 A1  3/2014 Martin et al.
2015/0123046 A1  5/2015 Jung et al.

OTHER PUBLICATIONS

Wu et al. ("Epitaxial and highly electrical conductive La0.5Sr0.5TiO3 films grown by pulsed laser deposition in vacuum"), J. Appl. Phys., vol. 88, 2000, pp. 700-704.*

Cho et al., "Optical transparency of metallic thin films", Appl. Phys. Lett. 79, 1426 (2001) (Year: 2001).*

Biswas et al. "La doped SrTiO3 thin films on SrLaAlO4 (001) as transparent conductor", Journal of APplied Physics, vol. 113, p. 183711, 2013. (Year: 2013).*

Kenneth R. Poeppelmeier et al., "Metals amassing tansparency", Nature Materials, Advance Online Publication, 2015, pp. 1-3.

Lei Zhang et al., "Correlated metals as transparent conductors", Nature Materials, Advance Online Publications, Published Online Dec. 14, 2015, pp. 1-8.

Zhuangchun Wu et al., "Transparent, Conductive Carbon Nanotube Films", Science, vol. 305, Aug. 27, 2004, pp. 1273-1273-1276.

Hui Wu et al., "A Transparent electrode based on a metal nanotrough network", Nature Nanotechnology, vol. 8, Jun. 2013, pp. 421-425.

Roy G. Gordon, "Criteria for Choosing Transparent Conductres" MRS Bulletin, Aug. 2000, pp. 52-57.

Sukang Bae et al., "Roll-to-roll production of 30-inch graphene films for transparent electrodes", Nature Nanotechnology, vol. 5, Aug. 2010, pp. 574-578.

International Search Report PCT/US2015/043274 dated Nov. 6, 2015.

Jayakanth Ravichandran et al., "An Epitaxial Transparent Conducting Perovskite Oxide: Double-Doped SrTiO3", Chem. Matter, 2010, 22, pp. 3983-3987.

J. H. Cho et al., "Optical transparency of metallic La 0.5 Sr 0.5 TiO3+6 thin films", Applied Physics Letters, vol. 79, No. 10, Sep. 3, 2001, pp. 1426-1428.

K. Kim et al., "Epitaxial (La,Sr)TiO3 as a conductive buffer for high temperature superconducting coated conductors", Solid-State Electronics 47 (2003) pp. 2177-2181.

* cited by examiner

TRANSPARENT CONDUCTING FILMS INCLUDING COMPLEX OXIDES

CROSS-REFERENCE TO RELATED APPLICATION

This application claims the benefit of U.S. Provisional Application No. 62/032,110 filed Aug. 1, 2014, the entire disclosure of which is hereby incorporated by reference herein.

STATEMENT REGARDING FEDERALLY SPONSORED RESEARCH

This invention was made with government support under Contract No. N00014-11-1-0665 awarded by The Office of Naval Research. The Government has certain rights in the invention.

TECHNICAL FIELD

The present disclosure relates to transparent conducting films (TCFs) such as TCFs for use in display technology, smart window technology, etc.

BACKGROUND

Transparent conducting films (TCFs) exhibit high electrical conductance and large optical transparency in a specified spectral range, such as ultraviolet, visible and infrared region, and are widely used in flat-panel display, touch panel displays, photovoltaic devices, light emitting diodes (LEDs), smart window technology, photodetectors and other optoelectronic devices.

The first widespread use of TCFs was as transparent electrical heaters for aircraft windshield de-icing in World War II by a partially oxidized cadmium film. Later, metal thin films could no longer meet the increasing high requirement of TCFs application. Besides the factor that metal thin films quickly tarnish in air and moisture, the electron mean free path (EMFP) of metal is usually much larger than the maximum thickness allowed for high transparency. In 1938, Fuchs showed that the resistivity of a thin film was significantly higher than that of the corresponding bulk material due to strong surface scattering, when the EMFP became smaller than the thickness of the film. See Fuchs, K. in Proc. Cambridge Philos. Soc. 100 (Cambridge Univ. Press). For example, the EMFP of silver ($\rho bulk=1.59$ $\mu\Omega$ cm) was 52 nm at room temperature.

To date degenerately doped wide band gap semiconductors, such as Al doped ZnO (AZO), tin doped indium oxide (ITO) and $SnO_2$ are widely used as TCF. ITO is the most widely used TCFs on the market. For example, the ITO-based thin Si solar cell has much higher fill factor (FF) than that of AZO-based one due to its high conductance A high FF increases the solar cell efficiency. The maximum power Pmax generated by a solar cell is given by Pmax=Voc Isc FF, with Voc the open circuit voltage and Isc the short circuit current. Higher fill factors leads to an increase in maximum power generated.

TCFs are optimized materials where doping close to the solubility limit is performed to maximize carrier concentration, while a high carrier mobility is ensured by choosing materials where the cation is a post transition metal, such as $Zn^{2+}$, $Cd^{2+}$, $In^{3+}$ or $Sn^{4+}$ (referred to as transparent conducting oxide (TCO) cations) and the conduction band is derived from the hybridization of the strongly delocalized s orbital and the oxygen p orbitals. Conduction bands have mainly s-orbital character, exhibiting a large band width and thus a small effective mass (typically below 0.3 free electron masses). These TCO materials allow for higher carrier concentration in excess of ~mid $10^{20}$ $cm^{-3}$ with high room temperature mobilities typically around 50~60 $cm^2$/V-s, which are highly desirable for the application of transparent conductors and currently strike the best balance of highest electrical conductivities and plasma frequencies below the visible spectrum (wP<~1 eV). See R. G. Gordon, MRS Bulletin 25, 52 (2000).

However, the supply of ITO to meet the rapidly increased demand for ITO has become a critical issue recently. The low abundance of In, has driven the price up, motivating people to search for alternative TCF materials. Higher conductivity is also needed for highly scaled structures, expanding the transmission window both into the UV (in half tone layers of phase shift masks for photolithography and future biotechnology such as transparent electrode for electrical sensing analysis of deoxyribonucleic acid (DNA) on a lab-on-a-chip, water sterilization) and near IR for (sensing, optical communication) are currently needed to enable other applications. However, further increasing the carrier concentration is limited by the solubility of the dopant atoms into the semiconducting host material, and increasing dopant concentration beyond ~mid $10^{20}$ $cm^{-3}$ can result in compensating doping as well as considerably reduced carrier mobility at room temperature due to enhanced impurity scattering. Conductivities larger than $10^4$ S/cm are barely exceeded for ITO.

Both, scaling film thickness and expanding the transmission window into the near IR and UV can be achieved by reducing the sheet resistance $R_s$. The figure of merit of transparent electrode is defined by sigma/alpha=$-\{R_s \ln(T\pm R)\}^{-1}$. See R. G. Gordon, MRS Bulletin 25, 52 (2000). To develop new TCF materials with a good FOM new strategies are required that are beyond the two design schemes of scaling conventional metals (Ag, Au, Al, Cu) and degenerately doped wide band gap semiconductors (ITO, AZO, $SnO_2$).

In this regard, Carbon based nanostructured materials have been proposed, such as graphene grown by chemical vapor deposition, and carbon nanotube meshes as well as metal nanotrough network and combinations thereof (metal mesh+ultrathin ITO). See Bae, S. et al., Nature nanotechnology 2010, 5, (8), 574-578; Wu, Z. et al., Science 2004, 305, (5688), 1273-1276.; Wu, H. et al., Nature nanotechnology 2013. However, due to the high synthesis and processing incompatibilities with existing and established fabrication routes and thus additional high costs, conventional thin film materials, namely degenerately doped wide band semiconductors and ultrathin metal thin films, are still the main workhorse as transparent electrode in industry. These new processes and materials have not been applied at large scale and the economics, supply and demand might negatively impact the feasibility of these lab-size tested approaches when transitioning to large quantities.

Ultimately, a new transparent conducting material has to be made out of abundant elements, should be chemically inert and have low toxicity, that is easy to integrate and straight forward to process, and should be fully compatible with current large volume TCFs production methods to enable utilization of existing equipment and ensure minimal capital investment by switching the existing PVD process capabilities to the new material. TCFs with higher conductivity and equal or better optical transmission in the wavelength interval of interest would allow manifold increase of throughput by reducing the film thickness required to maintain the same sheet resistance.

A need still exists for materials exhibiting a much higher electrical conductivity than degenerately doped semiconductor (>5×10$^3$ S/cm), which should rather be on the order of ~5×10$^4$ S/cm, therefore closing the gap to metals, while having a plasma frequency that is much lower than that of metals (~>5 eV) and rather comparable to degenerately doped semiconductors (~1 eV). Both requirements are competing demands, since both quantities depend on the ratio of carrier concentration and carrier effective mass n/m*. In fact, a large materials design space for tuning the plasma frequency and electrical conductivity through both, effective mass and free carrier concentration is highly desirable to increase the optical transparency in the IR range, while maintaining a high electrical conductivity. Expanding the transparent window into the UV range requires the suppression of optical interband transition, which can be achieved by ensuring the same occupancy of initial and final electronic state involved in the absorption of light at a specific wavelength.

US 2015/0123046 discloses transparent conductive thin film and an electronic device including the same. The transparent conductive thin film may include a perovskite vanadium oxide represented by $A_{1-x}VO_{3\pm\delta}$, where A is a Group II element, 0≤x<1, and δ is a number necessary for charge balance in the oxide.

However, a need still exists for transparent conductive thin film materials having improved optical and electrical properties to make them even thinner, more conductive and yet more optically transparent.

SUMMARY OF THE DISCLOSURE

An advantage of the present disclosure is a transparent conducting film including an alkaline earth transition metal oxide. Such complex oxide films can be used in electrodes for virtually all electric/electronic devices made from functional materials that need electrical contacts, including semiconductors, glass, organic materials, insulators or other devices.

These and other advantages are satisfied, at least in part, by a transparent conducting film comprising an alkaline earth, transition metal oxide having any one of the formulae:

  (I); or

  (II).

For each of formulae (I) and (II), A and A' are different from each other and A represents one or more divalent alkaline earth cations; A' represents either one or more trivalent cations or one or more monovalent cations; B and B' are different from each other and B represents a transition metal selected from group VB; and B' represents a transition metal from the groups VB, IVB, VIB, and/or elements from group IVA and/or IIIA. For formulae (I) d can be a value between −0.5≤d≤0.5 and the values for x and y are 0≤x≤1, 0≤y≤1. Preferably, when y is 0, B is not vanadium. For Formula (II) the transparent conducting film can comprise a laminated structure of chemical composition $(ABO_{3-d})_m$ $(A'B'O_{3-d'})_n$ and d and d' account for deviations from ideal oxygen stoichiometry of the individual layers (having values of −0.5≤d≤0.5 and −0.5≤d'≤0.5, respectively), and m and n account for the thickness of the individual nanolaminates in units of the perovskite unit cell (e.g., 1≤m≤10 and 1≤n≤10).

Embodiments of the disclosure include transparent conducting films including the transition metal oxide of Formula (I) wherein A represents one or more of Sr or Ca; A' represents one or more of La, Nd, Gd, or Dy, B represents one or more of V, Nb, or Ta, B' represents one or more of Cr, Mo or W, 0≤y≤1.0 and 0<x≤0.2, and −0.2<d<0.2; and of Formula (II) wherein A represents one or more of Sr or Ca. A' represents one or more of Sr or Ca, B represents one or more of V or Nb, B' represents one or more of V, Nb, Ta, or Mo, −0.5≤d≤0.5 and −0.5≤d'≤0.5, and 1≤m≤10 and 1≤n≤10.

Additional embodiments of the disclosure include, individually or in any combination of a transparent conducting film comprising the transition metal oxide of Formula (I) or (II) characterized by an electron mobility of about 1~100 cm$^2$/V/sec and/or a carrier density of about 1×10$^{21}$~2×10$^{23}$ cm$^{-3}$, and/or a transmittance of about 80% or more at a wavelength of 550 nm, and/or a thickness in the range of about 5 to 50 nm or higher, and/or an effective mass in the range of about 1 to 10 $m_0$ and/or conductivity of about 2000 S/cm (resistivity 5×10$^{-4}$ Ω×cm) to about 100000 S/cm (resistivity 1×10$^{-6}$ Ω×cm) at room temperature.

Another aspect of the present disclosure includes an electrode material comprising at least one of the transparent conducting films and an electrode including the electrode material on a substrate. Such substrates include those made of silicon, germanium, or a compound semiconductor with zinc blende or wurtzite crystal structure, with or without a thin transparent coating.

Another aspect of the present disclosure includes methods of forming transparent conducting films. The methods include providing or supplying in a chamber which houses the substrate a source for each of: (i) A and/or A', (ii) B and/or B' and (iii) oxygen; and activating each of: (i) A and/or A', (ii) B and/or B' and (iii) oxygen in the chamber to deposit the transparent conducting film on to the substrate.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein.

DETAILED DESCRIPTION OF THE DISCLOSURE

Figure 1:
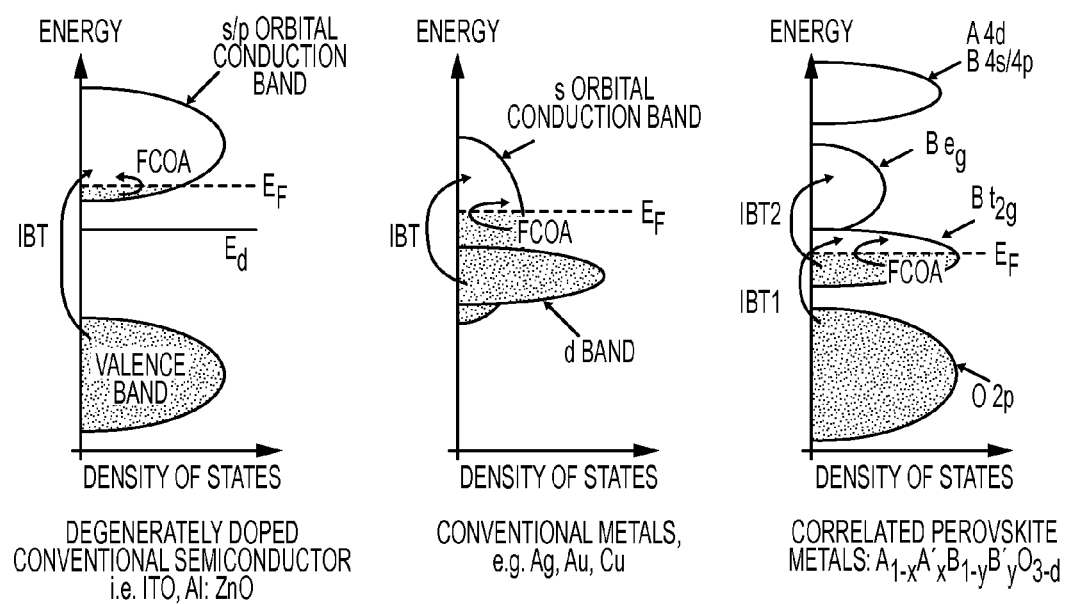
FIG. 1 is a schematic of band structures of alkaline earth transition metal oxide film with general chemical formula $A_{1-x}A'_xB_{1-y}B'_yO_{3-d}$.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted. Well-known process technologies may not explained in detail in order to avoid vague interpretations of example embodiments Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The present disclosure is directed to transparent conducting films that include an alkaline earth, transition metal oxide. Such complex oxide films can be used in electrodes for virtually all electric/electronic devices made from functional materials that need electrical contacts, including semiconductors, glass, organic materials, insulators or other devices. For example, such complex oxide films can be used in applications including without limitation portable multimedia/communication devices (smart phones, tablet, notebooks, e-ink readers) Light emitting diodes (LED, OLED), photovoltaics, electroluminescent displays (LCD displays, monitors, TV), optical detectors, as well as in the area of functional glass technology (transparent heater, touch-sensitive displays, electric smart glass, EMI, electrochromic glass) and plasmonic applications.

Complex oxide films of the present disclosure preferably have a perovskite structure. Perovskite refers to the structure of any material with the same type of crystal structure as calcium titanium oxide ($CaTiO_3$) and is named after Russian scientist, L. A. Perovski. As used herein, a perovskite structure can have the chemical formula $ABO_3$. In the idealized cubic unit cell of such a structure, element 'A' sits at cube corner positions (0, 0, 0), element 'B' atom sits at body center position (1/2, 1/2, 1/2) and oxygen atoms sit at face center positions (1/2, 1/2, 0).

As explained in the Background section, the rapidly increased demand for ITO in recent year is endangered by the scarcity and high price of indium element, motivating people to search for alternative materials. Certain limitation prevents further improving the properties of ITO. In order to achieve high conductance as a transparent electrode, one could either increase mobility or carrier concentration, according to the following formula:

$$\sigma = ne\mu = \frac{n\tau e^2}{m^*} \quad (1)$$

While n is carrier concentration and μ is electron mobility, m* is effective mass, τ is the scattering time. However, the maximum carrier concentration in degenerate semiconductor is limited by the dopant solubility ($1\sim2\times10^{21}$ cm$^{-3}$). Additional increase of carrier concentration from the extrinsic dopants severely degrades the mobility and reduces the optical transparency due to the free carrier absorption. Therefore, increasing the carrier concentration while maintaining a high carrier mobility is important to improve the performance of ITO.

Conventional metals exhibit much higher carrier concentration and slightly higher effective mass, such as Ag, Au, Al, Cu have dramatically higher conductivities, but associated with it a much higher plasma frequency.

$$\omega_p^2 = \frac{ne^2}{\varepsilon_0\varepsilon_r m^*} \quad (2)$$

The plasma frequency marks the frequency below which the material reflects light. For example, Ag, Al, Au and Cu have plasma frequency of 9.0 eV, 14.8 eV, 9.0 eV and 7.4 eV, respectively. Such a high plasma frequency makes these metal opaque in UV-VIS range, requiring an ultrathin film (<10 nm) to limit the reflection losses of light with frequencies below the plasma frequency of the material. Reducing film thicknesses below the electron mean free path (EMPF) L $$L = (3\pi^2 n)^{\frac{1}{3}} \times \frac{\hbar\mu}{e} \quad (3)$$

reduces the film's conductivity due to enhanced surface scattering of carriers. Electron mean free path of metals are typically around 50 nm, the strong light reflection of metals in the visible range require film thicknesses to be below 10 nm to be competitive for the application as transparent conductor.

Alkaline earth transition metal perovskite oxide metals have advantages in forming transparent conducting films over conventional metals or degenerately doped semiconductors with their intrinsic limits described above by the specific band structure, shown in FIG. 1. Unlike in the case of a degenerately doped semiconductor, where the performance as transparent conductor is limited by the small concentration of free moving carriers in the conduction band (formed from s and p hybridized orbitals) generated through doping, and the case of conventional metals, where the combination of very high carrier concentration and relatively small electron effective masses, determined by the Fermi level position intersecting with a conduction band with s-orbital character causes strong optical absorption of the free electrons, here the Fermi level is located in a very narrow conduction band with d-orbital character, which is more narrow than bands derived from s or p orbitals. Therefore free carriers exhibit a much heavier effective mass. This situation allows to create a material with high carrier concentration and high carrier effective mass, striking an ideal balance for the application as transparent conductor.

Such perovskite oxides with alkaline earth elements on the A-site, namely Mg, Ca, Sr, La and Ba, and VB transition metals occupying the B-site, namely V, Nb, and Ta, as well as their solid solutions reveal the specific material parameters that benefit their use as transparent conductor. Highly conductive, correlated metals with high carrier concentration and large effective mass, originated by the strong electron correlation effects, will display ideal plasma frequencies, larger than 1 eV (upper limit of degenerately doped semiconductors) and smaller than the frequency of light from the visible spectrum, and high electrical conductivities. Furthermore, the combination of high carrier concentration and high carrier effective mass positively affects EMFP (Eqn. 3) in alkaline earth transitional metal perovskite oxides down to as low as 5 nm. A significant decrease of conductivity with reduced thickness is not observed in these systems in the limit of ultrathin films. These transparent electrode material will enable scaling film thickness and thus decrease optical absorption without compromising its electrical conductance.

It is believed important that the Femi level intersects the bands derived from the d orbitals with t2g symmetry, which is achieved by putting alkaline earth elements on the A site and VB transition metal elements on the B site of the perovskite oxide. The choice of VB element (either V, Nb or Ta) has implications on the effective mass of the carriers, an important tuning parameter to enhance the performance metric of the transparent conductor (high electrical conductivity while being optically highly transparent). Using 4d or 5d orbitals from Nb or Ta instead of 3d orbital of V will increase the band width of the t2g band without changing the electronic configuration of the material, allowing to tune the carrier effective mass for optimizing the performance.

Aliovalent substitution of either A site alkaline earth element using a monovalent cation, e.g. lithium, sodium, potassium, rubidium or cesium, or a trivalent cation, e.g. lanthanum, cerium, praseodymium, neodymium, promethium, samarium, europium, gadolinium, terbium, dysprosium, holmium, erbium, thulium, ytterbium, or lutetium, is a strategy to further improve the property as a transparent conductor. The aliovalent substitution will change the carrier concentration and thus the Fermi level position within the t2g band. This has important implications because it allows enhancement of carrier concentration and thus conductivity without compromising the good optical transparency.

Fermi level positioning and tailoring the carrier concentration in the alkaline transition metal perovskite oxide is also achieved by aliovalent substitution of the VB element occupying the B-site, by either choosing a IVB element to lower the Fermi level, or VIB element to increase the Fermi level.

Although it seems counterintuitive at first to lower the carrier concentration, the position of the Fermi level in the t2g band (and thus the carrier concentration) determined the optically active interband transition and therefore directly affect the transmittance of the film. The absorption strength of two main transitions can therefore be engineered to enhance the transparency: The transition (1) from an occupied level in the t2g band into an unoccupied eg band, and the transition (2) from an occupied oxygen 2p band into an unoccupied t2g band. Changes in the carrier concentration can shift the absorption outside the range of the targeted spectrum, in which high optical transmittance is desired. Furthermore, changes in the carrier concentration can completely suppress interband optical transitions and thus eliminate optical absorption and enhance transmittance, if the same occupancy of the electronic states is properly chosen using aliovalent substitution.

Therefore, these alkaline earth transition metal perovskite oxides are strongly correlated metals, simultaneously has a considerably larger effective mass and lower carrier concentration, compared with traditional metal. Choosing these materials for the application as transparent conductor is counterintuitive, because according to existing materials design strategies for transparent conducting material, effective mass should be minimized to achieve a high mobility, and thus high electrical conductance. For the transparent conducting materials here, high conductance is largely ensured by fairly high carrier contribution ($\sim 10^{22}$ cm$^{-3}$), while the plasma frequency is reduced to below the visible range due to the high carrier mobility.

In certain embodiments of the present disclosure, transparent conducting films comprise an alkaline earth, transition metal oxide having any one of the formulae:

$$A_{1-x}A'_xB_{1-y}B'_yO_{3-d} \quad (I); \text{ or}$$

$$(ABO_{3-d})m(A'B'O_{3-d'})n \quad (II).$$

Formula (II) represents a laminate structure of a film composed of $(ABO_{3-d})m$ and another film composed of $(A'B'O_{3-d'})n$. For each of formulae (I) and (II), A and A' are different from each other. A and A' represent divalent alkaline earth elements, such as, for example, magnesium, calcium, strontium and barium. In addition, A' represents either (i) one or more trivalent elements, such as lanthanum, cerium, praseodymium, neodymium, promethium, samarium, europium, gadolinium, terbium, dysprosium, holmium, erbium, thulium, ytterbium, lutetium, or (ii) one or more monovalent cations, such as lithium, sodium, potassium, rubidium or cesium. For example, magnesium, calcium, strontium and barium can occupy the A and A'-sites and group V transition metal elements vanadium, niobium, tantalum can occupy the B and B'-sites.

In case A' represents an aliovalent element or a mixture thereof, A can represent a mixture of divalent alkaline earth elements, for example when A is a mixture of Sr and Ca, A' can be a rare earth element, such as La to give formula $(Sr,Ca)_{1-x}La_x—B_{1-y}B'_yO_{3-d}$.

For each of formulae (I) and (II), B and B' are different from each other. B represents a transition metal selected from group VB, such as vanadium, niobium or tantalum. B' represents VIB transition metals element, such as chromium, molybdenum, tungsten, or IVB transition elements, such as titanium, zirconium, hafnium, or group IIIA elements, such as boron, aluminum, gallium, indium, or group VA elements, such as carbon, silicon, germanium, tin.

In case B' represents an aliovalent element or a mixture thereof, B can represent a mixture of group VB elements, for example when B is a mixture of V and Nb, B' can be a VIB element, such as Mo to give the formula $A_{1-x}A'_x(V,Nb)_{1-y}Mo_yO_{3-d}$.

For Formula (I), d is a value between $-0.5 \leq d \leq 0.5$, e.g., d is a value between $-0.2 \leq d \leq 0.2$ or $-0.1 \leq d \leq 0.1$, and the values for x and y are $0 \leq x \leq 1$, $0 \leq y \leq 1$. Formula (I) represents a random mixture (e.g., a solid solution) of two different alkaline earth elements occupying the A site in $ABO_3$ structure, and two different transition metal elements or one transition metal element and an element from either group IIIA or IVA elements occupying the B site. In an embodiment of the present disclosure, when y is 0, B is not vanadium, i.e., when y=0, vanadium is excluded to occupy the B site.

Formula (II) represents a transparent conducting film comprised of a laminated structure (e.g., a nanolaminate structure) of chemical composition $(ABO_{3-d})_m(A'B'O_{3-d'})_n$. The values of d and d' account for deviations from ideal oxygen stoichiometry of the individual layers and have values of $-0.5 \leq d \leq 0.5$ and $-0.5 \leq d' \leq 0.5$, respectively. In an embodiment of the present disclosure d and d' can have values within the range of between $-0.2 \leq d \leq 0.2$ or $-0.1 \leq d \leq 0.1$ and between $-0.2 \leq d' \leq 0.2$ or $-0.1 \leq d' \leq 0.1$. The values of m and n account for the thickness of the individual nanolaminates in units of the perovskite unit cell (e.g., $1 \leq m \leq 10$ and $1 \leq n \leq 10$). Elements occupying A and/or A' site can be alkaline earth elements, e.g. Mg, Ca, Sr, Ba, trivalent elements, such as rare earths (lanthanum, cerium, praseodymium, neodymium, promethium, samarium, europium, gadolinium, terbium, dysprosium, holmium, erbium, thulium, ytterbium, or lutetium) or monovalent elements (lithium, sodium, potassium, rubidium or cesium), while elements occupying B and/or B' site can be transition metals from the groups VB, IVB and/or VIB as well as group IVA and/or group IIIA.

The random solid solution scheme of alkaline earth transition metal perovskite oxide given in chemical Formula (I) and the nanolaminate structure, representing an ordered solid solution, are superior to the material disclosed in US2015/0123046 because it provides additional design degrees of freedom to enhance the performance as transparent conductor, specifically tuning the carrier effective mass by choosing 4d and 5d elements, aliovalent substitution to increase electrical conductivity and enhancing optical transmittance. It is shown in examples that doping the trivalent La into the A site of $SrVO_3$, a material disclosed in US2015/0123046, shows much higher electrical conductivities albeit maintaining an excellent optical transmittance in the entire across the entire visible spectrum (demonstrated larger than 90% for a 10 nm thick film).

The ordered nanolaminate array is expected to show a better conductivity over the random solution because the number of potential scattering sites is reduced. Rather than having a high concentration of alien elements randomly dispersed, and each individual point defect contributing to electron scattering in the material, only the few interfaces formed between the nanolaminates of unit cell thicknesses m and n can cause additional scattering, reducing the scattering probability and increasing electron conductivity.

Advantageously, the Fermi level position in the conduction band of any of the oxides of formulae (I), or (II) can be adjusted by aliovalent substitution of A and/or A' and/or by aliovalent substitution of B and/or B' and/or by modulating d and/or d' within the limits $-0.5 \leq d \leq 0.5$ (e.g. between $-0.2 \leq d \leq 0.2$ or $-0.1 \leq d \leq 0.1$) and $-0.5 \leq d' \leq 0.5$ (e.g., between $-0.2 \leq d' \leq 0.2$ or $-0.1 \leq d' \leq 0.1$), respectively, and/or by aliovalent substitution of oxygen (at the anion site) by one or more of nitrogen or fluorine.

For example, the Fermi level position in the conduction band can be adjusted by aliovalent substitution of A and/or A' by using a monovalent cation or a trivalent cation. In addition, the Fermi level position in the conduction band can be adjusted by aliovalent substitution of B and/or B' by either choosing one or more group VIB transition metal elements (chromium, molybdenum and tungsten and combinations thereof); by one or more group IVB transition metal elements (e.g., titanium, zirconium, hafnium); group IIIA elements (e.g., boron, aluminum, gallium, indium); group IVA elements (e.g., carbon, silicon, germanium, tin).

A' or B' provides dopants to the host material, which could furthermore boost the electrical conductivity and enhance transmittance by reducing absorption strength of interband transition or shifting them outside the spectral range of interest for the application. For, example, $A_{1-x}A'_xB_{1-y}B'_yO_{3-d}$ could has a conductivity of at least 10%, 20%, 30% higher than $ABO_{3-d}$.

In an embodiment of the present disclosure, the transparent conducting film includes the oxide of Formula (I) wherein $0 < x \leq 0.1$ and A' is a trivalent cation, e.g., lanthanum. In another embodiment of the present disclosure, the transparent conducting film includes the oxide of Formula (I) wherein $0 < x \leq 0.1$ and A is Sr, A' is a trivalent cation, e.g., lanthanum, and B is vanadium.

Embodiments of the disclosure include transparent conducting films including the transition metal oxide of Formula (I) wherein A represents one or more of Sr or Ca; A' represents one or more of La, Nd, Gd, or Dy, B represents one or more of V, Nb, or Ta, B' represents one or more of Cr, Mo or W, $0 \leq y \leq 1.0$ and $0 < x \leq 0.2$, and $-0.2 < d < 0.2$. Another embodiment of formula (I) includes wherein A represents one or more of Sr or Ca; A' represents one or more of La, Nd, Gd, or Dy, B represents one or more of V, Nb, or Ta, B' represents Mo or W, $0.8 \leq y \leq 1.0$ and $0 < x \leq 1$, e.g., $0 < x \leq 0.2$, and $-0.5 < d < 0.5$, e.g., $-0.2 < d < 0.2$.

Particular embodiments of transition metal oxides of formula (I) that can be in the form of transparent conducting films include, for example: (vanadate based compounds): (A-site aliovalent substitution) $Sr_{1-x}A'_xVO_{3-d}$ with A'=La, Nd, Gd, or Dy and $0 < x \leq 0.2$, and $-0.2 < d < 0.2$; $Sr_{1-x}A'_xVO_{3-d}$ with A'=La, and $0 < x \leq 0.2$, and $-0.2 < d < 0.2$; $Ca_{1-x}A'_xVO_{3-d}$ with A'=La, Nd, Gd, or Dy and $0 < x \leq 0.2$, and $-0.2 < d < 0.2$; $Ca_{1-x}A'_xVO_{3-d}$ with A'=La, and $0 < x \leq 0.2$, and $-0.2 < d < 0.2$; $(Sr,Ca)_{1-x}A'_xVO_{3-d}$ with A'=La, Nd, Gd, or Dy and $0 < x \leq 0.2$, and $-0.2 < d < 0.2$; $(Sr,Ca)_{1-x}A'_xVO_{3-d}$ with A'=La, and $0 < x \leq 0.2$, and $-0.2 < d < 0.2$; (B-site isolvent mixing) $SrV_{1-y}Nb_yO_{3-d}$ with $0 \leq y \leq 0.2$, and $-0.2 < d < 0.2$; (combination of A-site aliovalent substitution and B-site isolvent mixing) $Sr_{1-x}A'_xV_{1-y}Nb_yO_{3-d}$ with A'=La, and $0 < x \leq 0.2$, and $0 \leq y \leq 0.2$ and $-0.2 < d < 0.2$; $Sr_{1-x}A'_xV_{1-y}Nb'_yO_{3-d}$ with A'=La, Nd, Gd, or Dy and $0 \leq x \leq 0.2$, $0 \leq y \leq 0.2$, and $-0.2 < d < 0.2$; $Sr_{1-x}A'_xV_{1-y}Ta'_yO_{3-d}$ with A'=La, Nd, Gd, or Dy and $0 \leq x \leq 0.2$, $0 \leq y \leq 0.2$, and $-0.2 < d < 0.2$; (B-site aliovalent substitution) $SrV_{1-y}B'_yO_{3-d}$ with B'=Cr, Mo or W, $0 \leq y \leq 0.2$, and $-0.2 < d < 0.2$; $SrV_{1-y}B'_yO_{3-d}$ with B'=Mo, $0 \leq y \leq 0.2$, and $-0.2 < d < 0.2$; $SrV_{1-y}B'_yO_{3-d}$ with B'=Mo, $0.8 \leq y \leq 1.0$, and $-0.2 < d < 0.2$; $CaV_{1-y}B'_yO_{3-d}$ with B'=Cr, Mo or W, $0 \leq y \leq 0.2$, and $-0.2 < d < 0.2$; $CaV_{1-y}B'_yO_{3-d}$ with B'=Mo, $0 \leq y \leq 0.2$, and $-0.2 < d < 0.2$; $CaV_{1-y}B'_yO_{3-d}$ with B'=Mo, $0.8 \leq y \leq 1.0$, and $-0.2 < d < 0.2$; $(Sr,Ca)V_{1-y}B'_yO_{3-d}$ with B'=Cr, Mo or W, $0 \leq y \leq 0.2$, and $-0.2 < d < 0.2$; $(Sr,Ca)V_{1-y}B'_yO_{3-d}$ with B'=Mo, $0 \leq y \leq 0.2$, and $-0.2 < d < 0.2$; $(Sr,Ca)V_{1-y}B'_yO_{3-d}$ with B'=Mo, $0.8 \leq y \leq 1.0$, and $-0.2 < d < 0.2$; (A-site and B-site aliovalent substitution) $Sr_{1-x}A'_xV_{1-y}B'_yO_{3-d}$ with A'=La, Nd, Gd, or Dy, B'=Cr, Mo or W and $0 < x \leq 0.2$, $0 < y \leq 0.2$, and $-0.2 < d < 0.2$; $Ca_{1-x}A'_xV_{1-y}B'_yO_{3-d}$ with A'=La, Nd, Gd, or Dy, B'=Cr, Mo or W and $0 < x \leq 0.2$, $0 < y \leq 0.2$, and $-0.2 < d < 0.2$; $(Sr,Ca)_{1-x}A'_xV_{1-y}B'_yO_{3-d}$ with A'=La, Nd, Gd, or Dy, B'=Cr, Mo or W and $0 < x \leq 0.2$, $0 < y \leq 0.2$, and $-0.2 < d < 0.2$; $Ca_{1-x}A'_xV_{1-y}B'_yO_{3-d}$ with A'=La, Nd, Gd, or Dy, B'=Mo and $0 < x \leq 0.2$, $0.8 \leq y \leq 1.0$, and $-0.2 < d < 0.2$; $Sr_{1-x}A'_xV_{1-y}B'_yO_{3-d}$ with A'=La, Nd, Gd, or Dy, B'=Mo and $0 < x \leq 0.2$, $0.8 \leq y \leq 1.0$, and $-0.2 < d < 0.2$; $(Sr,Ca)_{1-x}A'_xV_{1-y}B'_yO_{3-d}$ with A'=La, Nd, Gd, or Dy, B'=Mo and $0 < x \leq 0.2$, $0.8 \leq y \leq 1.0$, and $-0.2 < d < 0.2$; (niobate based compounds): (A-site aliovalent substitution)

$Sr_{1-x}A'_xNbO_{3-d}$ with A'=La, Nd, Gd, or Dy and $0<x\le0.2$, and $-0.2<d<0.2$; $Sr_{1-x}A'_xNbO_{3-d}$ with A'=La, and $0<x\le0.2$, and $-0.2<d<0.2$; $Ca_{1-x}A'_xNbO_{3-d}$ with A'=La, Nd, Gd, or Dy and $0<x\le0.2$, and $-0.2<d<0.2$; $Ca_{1-x}A'_xNbO_{3-d}$ with A'=La, and $0<x\le0.2$, and $-0.2<d<0.2$; $(Sr,Ca)_{1-x}A'_xNbO_{3-d}$ with A'=La, Nd, Gd, or Dy and $0<x\le0.2$, and $-0.2<d<0.2$; $(Sr,Ca)_{1-x}A'_xNbO_{3-d}$ with A'=La, and $0<x\le0.2$, and $-0.2<d<0.2$; (B-site isolevent mixing) $SrNb_{1-y}V_yO_{3-d}$ with $0\le y\le0.2$, and $-0.2<d<0.2$; $SrNb_{1-y}Ta_yO_{3-d}$ with $0\le y\le0.2$, and $-0.2<d<0.2$; (Combination of A-site aliovalent substitution and B-site isolevent mixing) $Sr_{1-x}A'_xNb_{1-y}V_yO_{3-d}$ with A'=La, and $0<x\le0.2$, and $0\le y\le0.2$ and $-0.2<d<0.2$; $Sr_{1-x}A'_xNb_{1-y}V'_yO_{3-d}$ with A'=La, Nd, Gd, or Dy and $0\le x\le0.2$, $0\le y\le0.2$, and $-0.2<d<0.2$; $Sr_{1-x}A'_xNb_{1-y}Ta'_yO_{3-d}$ with A'=La, Nd, Gd, or Dy and $0\le x\le0.2$, $0\le y\le0.2$, and $-0.2<d<0.2$; (B-site aliovalent substitution) $SrNb_{1-y}B'_yO_{3-d}$ with B'=Cr, Mo or W, $0\le y\le0.2$, and $-0.2<d<0.2$; $SrNb_{1-y}B'_yO_{3-d}$ with B'=Mo, $0\le y\le0.2$, and $-0.2<d<0.2$; $SrNb_{1-y}B'_yO_{3-d}$ with B'=Mo, $0.8\le y\le1.0$, and $-0.2<d<0.2$; $CaNb_{1-y}B'_yO_{3-d}$ with B'=Cr, Mo or W, $0\le y\le0.2$, and $-0.2<d<0.2$; $CaNb_{1-y}B'_yO_{3-d}$ with B'=Mo, $0\le y\le0.2$, and $-0.2<d<0.2$; $CaNb_{1-y}B'_yO_{3-d}$ with B'=Mo, $0.8\le y\le1.0$, and $-0.2<d<0.2$; $(Sr,Ca)Nb_{1-y}B'_yO_{3-d}$ with B'=Cr, Mo or W, $0\le y\le0.2$, and $-0.2<d<0.2$; $(Sr,Ca)Nb_{1-y}B'_yO_{3-d}$ with B'=Mo, $0\le y\le0.2$, and $-0.2<d<0.2$; $(Sr,Ca)Nb_{1-y}B'_yO_{3-d}$ with B'=Mo, $0.8\le y\le1.0$, and $-0.2<d<0.2$; (A-site and B-site aliovalent substitution) $Sr_{1-x}A'_xNb_{1-y}B'_yO_{3-d}$ with A'=La, Nd, Gd, or Dy, Mo or W and $0<x\le0.2$, $0<y\le0.2$, and $-0.2<d<0.2$; $Ca_{1-x}A'_xNb_{1-y}B'_yO_{3-d}$ with A'=La, Nd, Gd, or Dy, B'=Cr, Mo or W and $0<x\le0.2$, $0<y\le0.2$, and $-0.2<d<0.2$; $(Sr,Ca)_{1-x}A'_xNb_{1-y}B'_yO_{3-d}$ with A'=La, Nd, Gd, or Dy, B'=Cr, Mo or W and $0<x\le0.2$, $0<y\le0.2$, and $-0.2<d<0.2$; $Ca_{1-x}A'_xNb_{1-y}B'_yO_{3-d}$ with A'=La, Nd, Gd, or Dy, B'=Mo and $0<x\le0.2$, $0.8\le y\le1.0$, and $-0.2<d<0.2$; $Sr_{1-x}A'_xNb_{1-y}B'_yO_{3-d}$ with A'=La, Nd, Gd, or Dy, B'=Mo and $0<x\le0.2$, $0.8\le y\le1.0$, and $-0.2<d<0.2$; $(Sr,Ca)_{1-x}A'_xNb_{1-y}B'_yO_{3-d}$ with A'=La, Nd, Gd, or Dy, B'=Mo and $0<x\le0.2$, $0.8\le y\le1.0$, and $-0.2<d<0.2$; (Ta based compounds): (A-site aliovalent substitution) $Sr_{1-x}A'_xTaO_{3-d}$ with A'=La, Nd, Gd, or Dy and $0<x\le0.2$, and $-0.2<d<0.2$; $Sr_{1-x}A'_xTaO_{3-d}$ with A'=La, and $0<x\le0.2$, and $-0.2<d<0.2$; $Ca_{1-x}A'_xTaO_{3-d}$ with A'=La, Nd, Gd, or Dy and $0<x\le0.2$, and $-0.2<d<0.2$; $Ca_{1-x}A'_xTaO_{3-d}$ with A'=La, and $0<x\le0.2$, and $-0.2\le d\le0.2$; $(Sr,Ca)_{1-x}Ta'_xVO_{3-d}$ with A'=La, Nd, Gd, or Dy and $0<x\le0.2$, and $-0.2<d<0.2$; $(Sr,Ca)_{1-x}Ta'_xVO_{3-d}$ with A'=La, and $0<x\le0.2$, and $-0.2<d<0.2$; (B-site isolevent mixing) $SrTa_{1-y}Nb_yO_{3-d}$ with $0\le y\le0.2$, and $-0.2<d<0.2$; $SrTa_{1-y}V_yO_{3-d}$ with $0\le y\le0.2$, and $-0.2<d<0.2$; (combination of A-site aliovalent substitution and B-site isolevent mixing) $Sr_{1-x}A'_xTa_{1-y}Nb_yO_{3-d}$ with A'=La, and $0<x\le0.2$, and $0\le y\le0.2$ and $-0.2<d<0.2$; $Sr_{1-x}A'_xTa_{1-y}Nb'_yO_{3-d}$ with A'=La, Nd, Gd, or Dy and $0\le x\le0.2$, $0\le y\le0.2$, and $-0.2<d<0.2$; $Sr_{1-x}A'_xTa_{1-y}V'_yO_{3-d}$ with A'=La, Nd, Gd, or Dy and $0\le x\le0.2$, $0\le y\le0.2$, and $-0.2<d<0.2$; (B-site aliovalent substitution) $SrTa_{1-y}B'_yO_{3-d}$ with B'=Cr, Mo or W, $0\le y\le0.2$, and $-0.2<d<0.2$; $SrTa_{1-y}B'_yO_{3-d}$ with B'=Mo, $0\le y\le0.2$, and $-0.2<d<0.2$; $SrTa_{1-y}B'_yO_{3-d}$ with B'=Mo, $0.8\le y\le1.0$, and $-0.2<d<0.2$; $CaTa_{1-y}B'_yO_{3-d}$ with B'=Cr, Mo or W, $0\le y\le0.2$, and $-0.2<d<0.2$; $CaTa_{1-y}B'_yO_{3-d}$ with B'=Mo, $0\le y\le0.2$, and $-0.2<d<0.2$; $CaTa_{1-y}B'_yO_{3-d}$ with B'=Mo, $0.8\le y\le1.0$, and $-0.2<d<0.2$; $(Sr,Ca)Ta_{1-y}B'_yO_{3-d}$ with B'=Cr, Mo or W, $0\le y\le0.2$, and $-0.2<d<0.2$; $(Sr,Ca)Ta_{1-y}B'_yO_{3-d}$ with B'=Mo, $0\le y\le0.2$, and $-0.2<d<0.2$; $(Sr,Ca)Ta_{1-y}B'_yO_{3-d}$ with B'=Mo, $0.8\le y\le1.0$, and $-0.2<d<0.2$; (A-site and B-site aliovalent substitution) $Sr_{1-x}A'_xTa_{1-y}B'_yO_{3-d}$ with A'=La, Nd, Gd, or Dy, B'=Cr, Mo or W and $0<x\le0.2$, $0<y\le0.2$, and $-0.2<d<0.2$; $Ca_{1-x}A'_xTa_{1-y}B'_yO_{3-d}$ with A'=La, Nd, Gd, or Dy, Mo or W and $0<x\le0.2$, $0<y\le0.2$, and $-0.2<d<0.2$; $(Sr,Ca)_{1-x}A'_xTa_{1-y}B'_yO_{3-d}$ with A'=La, Nd, Gd, or Dy, B'=Cr, Mo or W and $0<x\le0.2$, $0<y\le0.2$, and $-0.2<d<0.2$; $Ca_{1-x}A'_xTa_{1-y}B'_yO_{3-d}$ with A'=La, Nd, Gd, or Dy, B'=Mo and $0<x\le0.2$, $0.8\le y\le1.0$, and $-0.2<d<0.2$; $Sr_{1-x}A'_xTa_{1-y}B'_yO_{3-d}$ with A'=La, Nd, Gd, or Dy, B'=Mo and $0<x\le0.2$, $0.8\le y\le1.0$, and $-0.2<d<0.2$; $(Sr,Ca)_{1-x}A'_xTa_{1-y}B'_yO_{3-d}$ with A'=La, Nd, Gd, or Dy, B'=Mo and $0<x\le0.2$, $0.8\le y\le1.0$, and $-0.2<d<0.2$.

Embodiments of the disclosure include transparent conducting films including the transition metal oxide of Formula (II) wherein A represents one or more of Sr or Ca, A' represents one or more of Sr or Ca, B represents one or more of V or Nb, B' represents one or more of V, Nb, Ta, or Mo, $-0.5\le d\le0.5$ and $-0.5\le d'\le0.5$, and $1\le m\le10$ and $1\le n\le10$.

Particular embodiments of transition metal oxides of Formula (I) Formula (II) that can be in the form of transparent conducting films include, for example: A=Sr, B=V, A'=Ca, B'=V; A=Sr, B=V, A'=Sr, B'=Nb; A=Sr, B=V, A'=Ca, B'=Nb; A=Sr, B=Nb, A'=Ca, B'=Nb; A=Sr, B=Nb, A'=Sr, B'=Ta; A=Sr, B=Nb, A'=Ca, B'=Ta; A=Sr, B=V, A'=Ca, B'=Mo; A=Sr, B=V, A'=Sr, B'=Mo; A=Ca, B=V, A'=Sr, B'=Mo; A=Ca, B=V, A'=Ca, B'=Mo; A=Ca, B=V, A'=Sr, B'=Mo; A=Sr, B=V, A'=Ca, B'=Mo; A=(Sr,Ca), B=V, A'=(Sr,Ca), B'=Mo; B=V, A'=(Sr,Ca), B'=Mo; A=Sr, B=Nb, A'=Ca, B'=Mo; A=Sr, B=Nb, A'=Sr, B'=Mo; A=Ca, B=Nb, A'=Sr, B'=Mo; A=(Sr,Ca), B=Nb, A'=(Sr,Ca), B'=Mo; A=(Sr,La), B=Nb, A'=(Sr,Ca), B'=Mo; A=Ca, B=Nb, A'=Ca, B'=Mo; A=Ca, B=Nb, A'=Sr, B'=Mo; A=Sr, B=Nb, A'=Ca, B'=Mo; B=Nb, A'=(Sr,Ca), B'=Mo; A=(Sr,La), B=Nb, A'=(Sr,Ca), B'=Mo wherein $1\le m\le10$ and $1\le n\le10$.

In an aspect of the present disclosure, the transparent conducting films are characterized by an electron mobility of about 1-100 $cm^2$/V/sec and/or a carrier density of about $1\times10^{21}\sim2\times10^{23}$ $cm^{-3}$, and/or a transmittance of about 80% or more at a wavelength of 550 nm, and/or a thickness in the range of about 5 to 50 nm or higher, and/or an effective mass in the range of about 1 to 10 $m_0$ and/or conductivity of about 2000 S/cm (resistivity $5\times10^{-4}$ $\Omega\times cm$) to about 100,000 S/cm (resistivity $1\times10^{-6}$ $\Omega\times cm$) at room temperature. Such materials would include, for example, $Sr_{0.99}La_{0.01}VO_3$, $Sr_{0.98}La_{0.02}VO_3$, $Sr_{0.97}La_{0.03}VO_3$, $Sr_{0.96}La_{0.04}VO_3$ and $Sr_{0.05}La_{0.05}VO_3$.

In an aspect of the present disclosure, an electrode material comprises at least one of the transparent conducting films disclosed herein on a substrate. The substrate can be of a variety of compositions including, for example, silicon, germanium, or a compound semiconductor with zinc blende or wurtzite crystal structure, with or without a thin transparent coating. The substrate can also be a glass substrate, an oxide deposited substrate, a plastic substrate.

Transparent conducting films of the present disclosure and electrode materials comprising them can be formed on a variety of substrates and under a variety of conditions. Generally, the transparent conducting films of the present disclosure can be formed by: providing or supplying in a chamber which houses the substrate a source for each of: (i) A and A', (ii) B and B' and (iii) oxygen; and activating each of: (i) A and A', (ii) B and B' and (iii) oxygen in the chamber to deposit the transparent conducting film on to the substrate. The chamber can be at or above atmospheric pressure or under reduced pressure depending on the particular technique.

The quality of the films deposited by the methods influences the performance of the material as transparent conductor. Direct comparison of films grown by the methods detailed here and the direct comparison of electrical conductivities and optical transmittance achieved for 10-nm thick films using the composition $SrVO_3$ and data reported in US2015/0123046 are testament of the important role of the thin film deposition technique employed. In this specific case the proper thin film synthesis method conductivities as high as 34483 S/cm was achieved (3200 S/cm in US2015/0123046) and an optical transmittance of a 10-nm-thick film of more than 85% determined experimentally at 550 nm (83% only calculated in US2015/0123046). The thin film techniques used to grow the transparent conducting film of formulae (I) and/or (II) should allow for high density films, low film surface roughness, good crystallinity and low density of grain boundaries. Unlike other thin film deposition techniques, thin film growth methods described below are particularly suited to deposit transparent conductors $A_{1-x}A'_xB_{1-y}B'_yO_{3-d}$ or $(ABO_{3-d})_m(A'B'O_{3-d'})$.

Figure 2:
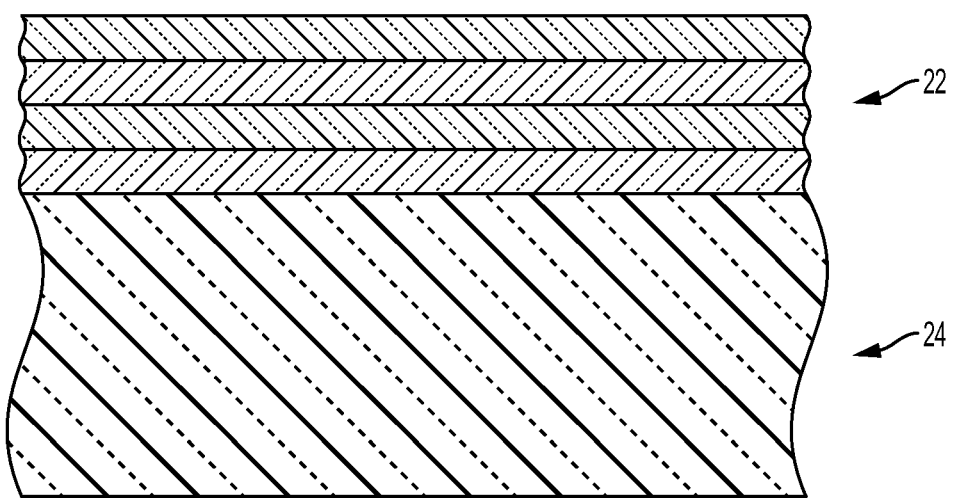
FIG. 2 illustrates a laminate structure showing a multi-layer film structure of a material of Formula (II): $(ABO_{3-d})$ $m(A'B'O_{3-d'})n$ over a substrate.
Figure 3:
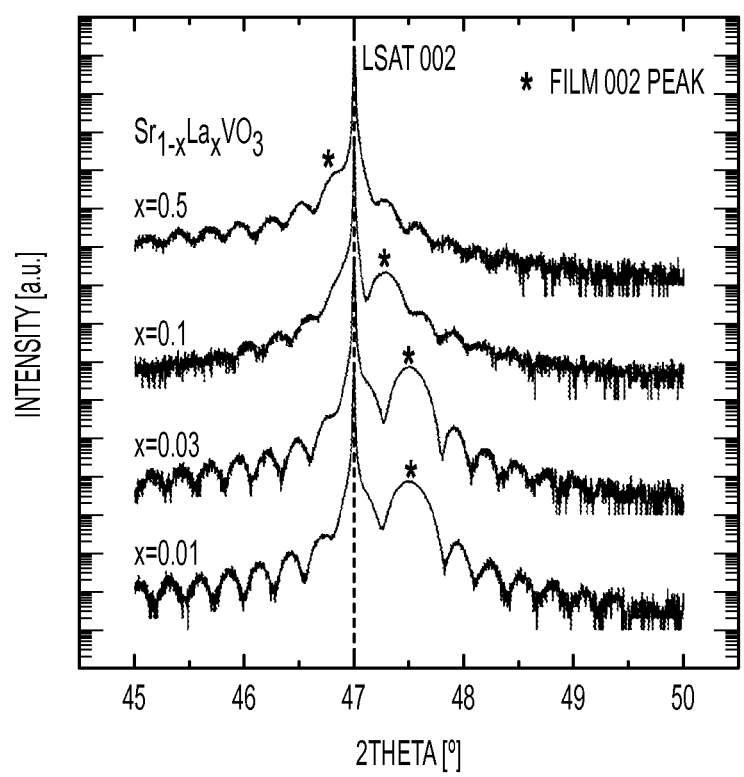
FIG. 3 is an X-ray diffraction pattern of $Sr_{1-x}La_xVO_3$ films on LSAT substrate. The film 002 peak was denoted by * symbol.

A physical vapor deposition method of forming a transparent conducting thin film with composition and structure given by the chemical composition formulae: $A_{1-x}A'_xB_{1-y}B'_yO_{3-d}$ or $(ABO_{3-d})_m(A'B'O_{3-d'})$ and comprises the steps of: providing an individual supply source for A, A', B and B' elements or a material containing any combination thereof which providing sources of dopants for aliovalent A-site and B-site substitution and a substrate to be coated in a low pressure vessel; evacuating the vessel to total gas pressures below 0.01 mTorr; heating and maintaining a substrate temperature in the range of room temperature to 600° C.; provide an oxidizing agent by injecting molecular oxygen, atomic oxygen, ozone, NO, N.sub.2O, NO.sub.2, H.sub.2O, H.sub.2O.sub.2 or any combination thereof into the low pressure vessel through a gas distribution showerhead in the line of sight to the substrate and controlling the flow of the oxidizer to limit the maximum pressure in the vessel to 0.1 mTorr. Generating a flux of particles from material supply sources can be achieved either by thermal evaporation by heating the sources and directing the particle flux onto the substrate, e-beam evaporation by directing an electron beam onto the charge of the material supply source or by ablating or abrasing the material using ions. Different types of physical vapor deposition sources, such as e-beam evaporator, thermal evaporator, sputter gun, can be used to supply the elements A, A', B and B'. Sequencing the operation of individual material supply sources allows the formation of the nanolaminate structure $(ABO_{3-d})_m(A'B'O_{3-d'})$. See, e.g., FIG. 2 which shows a laminate structure comprised of $(ABO_{3-d})_m(A'B'O_{3-d'})$ 22 over substrate 24.

A chemical vapor deposition (CVD) or atomic layer deposition (ALD) method of forming a transparent electrode comprises the steps of: evacuate the vessel to total gas pressures within Torr range or below; heating and maintaining a substrate temperature in the range of room temperature to 1200° C. The carrier gas could be any inert gas, such as argon and nitrogen. In operating the metal organic chemical vapor deposition apparatus, the carrier gas is introduced into the bubbler. Organometallic compounds containing elements A, A', B, B' are individually transported by the carrier gas and continuously directed to the deposition chamber. The flow rates for the carrier gas generally will range from one centimeter per minute to ten liters per minute. Vapor of a A-site and A'-site element containing precursors, for example Sr ($^iPr_3CP)_2$, Bis(2,2,6,6-tetramethyl-3,5-heptanedionato)strontium with chemical formula $Sr(C_{11}H_{19}O_2)_2$, Strontium hexafluoroacetylacetonate with chemical formula $Sr(CF_3COCHCOCF_3)_2$ and La, Lanthanum(III) isopropoxide with chemical formula $C_9H_{21}LaO_3$, tris[N,N-bis(trimethylsilyl)amide]lanthanum(III) with chemical formula $La(N(Si(CH_3)_3)_2)_3$, Tris(cyclopentadienyl)lanthanum(III) with chemical formula of $La(C_5H_5)_3$, Tris(tetramethylcyclopentadienyl)lanthanum(III) with chemical formula of $C_{27}H_{39}La$, Tris(2,2,6,6-tetramethyl-3,5-heptanedionato)lanthanum(III) with chemical formula of $La(C_{11}H_{19}O_2)_3$, Tris (i-propylcyclopentadienyl)lanthanum with chemical formula of $(C_3H_7C_5H_4)_3La$, vapor is transported in an inert gas. Vapors of a B-site and B'-site containing precursors, for example vanadium oxytriisopropoxide with chemical formula of $VO(O-^iPr)_3$, Vanadium(V) trichloride oxide with chemical formula of $VOCl_3$, Cyclopentadienylvanadium tetracarbonyl with chemical formula of $C_5H_5V(CO)_4$, Tetrakis(diethylamino)vanadium(IV) with chemical formula of $V[N(CH_2CH_3)_2]_4$, Vanadium(III) acetylacetonate with chemical formula of $V(CH_3COCHCOCH_3)_3$, Tetrakis(dimethylamino)vanadium(IV) with chemical formula of $V[N(CH_3)_2]_4$ or niobium ethoxide with chemical formula of $Nb[OCH_2CH_3]_5$, Niobium(V) chloride with chemical formula of $NbCl_5$, Pentakis(dimethylamino)niobium(V) with chemical formula of $Nb[N(CH_3)_2]_5$, (t-Butylimido) tris(diethylamino) niobium(V) with chemical formula of $C_{16}H_{39}N_4Nb$, Tetrakis(2,2,6,6-tetramethyl-3,5-heptanedionato)niobium(IV) with chemical formula of $Nb(C_{11}H_{19}O_2)_4$, Trihydridobis(pentamethylcyclopentadienyl)niobium(V) with chemical formula of $[(CH_3)_5C_5]_2NbH_3$ is transported in an inert gas. Similar precursor are commercially available for the other elements of interest as well. The reactant precursor could also be atomic oxygen, molecular oxygen, ozone, hydrogen peroxide, a water-hydrogen peroxide mixture, alcohol, or nitrous oxide, to increase the activity of oxygen. Contacting said heated substrate in an oxidizing atmosphere with vapors from said strontium and vanadium to form said oxide on said substrate. Timing and carrier gas flux modulation provides control over the supply rate of the individual elements and thus compositional control over $A_{1-x}A'_xB_{1-y}B'_yO_{3-d}$. Sequencing the carrier gas through different MO precursors allows nanolaminate synthesis $(ABO_{3-d})_m(A'\ B)_n$.

In case of the ALD method, water vapor is used as an oxygen reactant and held in a reservoir held in a bath at 25° C. The reactant precursor could also be atomic oxygen, molecular oxygen, ozone, hydrogen peroxide, a water-hydrogen peroxide mixture, alcohol, or nitrous oxide, to increase the activity of oxygen. The ALD chamber is purged with inert gas. Organometallic precursor containing elements A, A', B, B' are injected into the reactor to expose the substrate to specific doses of these precursors. Organometallic precursor doses will be alternated with oxidizing agent doses, such as molecular oxygen, atomic oxygen, ozone, NO, $N_2O$, $NO_2$, $H_2O$, $H_2O_2$ or any combination thereof, separated by purging cycles between the pulses using an inert gas. Repeating a selected number of ALD cycles and dosing times provides compositional control over $A_{1-x}A'_xB_{1-y}B'_yO_{3-d}$. Proper sequencing of the gas pulses allows the deposition of the nanolaminate structure $(ABO_{3-d})_m(A'B'O_{3-d'})_n$.

Another method combining the physical vapor deposition and chemical vapor deposition, for example hybrid molecular beam epitaxy or Hybrid MBE. Forming a transparent electrode comprises the steps of: evacuate the vessel to total gas pressures below $1\times10^{-5}$ Torr; heating and maintaining a substrate temperature in the range of 300 to 1000° C.; opening shutters in the apparatus to supply A, A', B, B' elements to said substrate either by using a precursor, or physical vapor deposition material supply sources; as described above.

Target materials for use in the above-referenced methods can be formed, for example, by mixing powders of alkaline earth carbonate, e.g., $ACO_3$ and a group VB transition metal binary oxide $B_xO_y$, wet milling, drying, molding, calcination of the mixed powders and pressing it into a target form and sinter it. The sintering of the body can be performed at temperatures higher than 600° C. and lower than 1200° C.

EXAMPLES

The following examples are intended to further illustrate certain preferred embodiments of the invention and are not limiting in nature. Those skilled in the art will recognize, or be able to ascertain, using no more than routine experimentation, numerous equivalents to the specific substances and procedures described herein.

$A_{1-x}A'_xB_{1-y}B'_yO_{3-d}$ with A=Sr, B=V, x=0.0, 0.01, 0.03, 0.1, 0.5, y=0 was grown on LSAT $((LaAlO_3)_{0.3} (Sr_2AlTaO_6)_{0.7})$ substrate using a DCA M600 molecular beam epitaxy (MBE) system with a base pressure of $5\times10^{-10}$ Torr generated by a turbo molecular pump (pumping speed for nitrogen≈1900 L s$^{-1}$) and a cryo pump (pumping speed for air≈1500 L s$^{-1}$). A heated gas inlet system was used to supply vanadium using the metalorganic precursor vanadium (V) oxytriisopropoxide (VTIP), the VTIP container vessel was held at 60° C. to ensure sufficient vapor pressure; no additional carrier gas was used. La and Sr were supplied using physical vapor deposition supply sources, specifically thermal evaporation sources. Before deposition, substrates were ultrasonically cleaned in acetone, isopropanol and de-ionized water and baked at 150° C. in the load lock for 90 min, followed by a 20 min oxygen plasma anneal (RF plasma power 250 W) at nominal temperature of 850° C. (thermocouple reading). $Sr_{1-x}La_xVO_3$ thin films were grown in a background pressure of molecular oxygen ($P_{Ox}=2\times10^{-7}$ Torr) with the substrate heater set to 850° C. (thermocouple reading) by co-supplying metallic Sr and La, evaporated from a dual-filament effusion cell and a high temperature effusion cell, and the metal organic precursor VTIP (at 56 mTorr gas inlet pressure) supplied through a heated gas inlet system.

TABLE 1

EMFP calculated based on derived equations at room temperature[9]

| Materials | Resistivity Ω × cm | Carrier concentration m$^{-3}$ | Electron mean free path nm |
|---|---|---|---|
| Cu | 1.70 × 10$^{-6}$ | 8.45 × 10$^{28}$ | 39 |
| Ag | 1.61 × 10$^{-6}$ | 5.85 × 10$^{28}$ | 52 |
| Al | 2.74 × 10$^{-6}$ | 1.81 × 10$^{29}$ | 15 |

X-ray diffraction was used to investigate the crystal structure of $Sr_{1-x}La_xVO_3$. High-quality $Sr_{1-x}La_xVO_3$ epitaxial films were grown. Kiessig fringes indicate smooth film surface and films substrate interface. XRD pattern shows single crystalline film, XRD peak width indicates low density of structural imperfections fringe. Kiessig fringe period was used to determine the film thickness, which was shown in Table 2.

TABLE 2

Electrical conductivity as a function of aliovalent substitution x in $Sr_{1-x}La_xVO_3$.

| composition | film thickness (nm) | conductivity (S/cm) |
|---|---|---|
| SrVO$_3$ | 45.0 | 34483 |
| Sr$_{0.99}$La$_{0.01}$VO$_3$ | 32.9 | 39893 |

TABLE 2-continued

Electrical conductivity as a function of aliovalent substitution x in $Sr_{1-x}La_xVO_3$.

| composition | film thickness (nm) | conductivity (S/cm) |
|---|---|---|
| Sr$_{0.97}$La$_{0.03}$VO$_3$ | 34.5 | 40169 |
| Sr$_{0.9}$La$_{0.1}$VO$_3$ | 36.1 | 16757 |
| Sr$_{0.5}$La$_{0.5}$VO$_3$ | 36.1 | 12320 |

Figure 4:
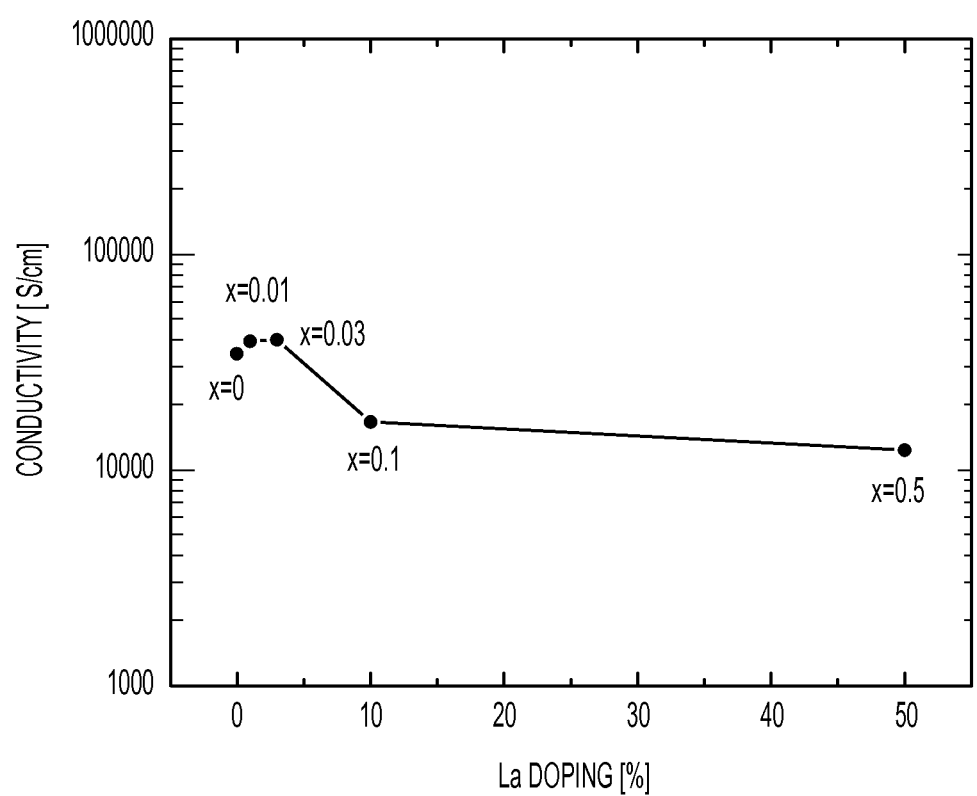
FIG. 4 is a chart showing electrical conductivity as a function of lanthanum substitution percentage x for $Sr_{1-x}La_xVO_3$ for x=0, 0.01, 0.03, 0.1 and 0.5.

The electrical conductivity of $Sr_{1-x}La_xVO_3$ films was measured by a four-point probe with Van der Pauw geometry. The highest conductivity of 40169 S/cm was achieved for $Sr_{0.97}La_{0.03}VO_3$, which is 16.4% higher than that of pure SrVO$_3$ grown by the same method as shown in FIG. 4 and Table 2. The conductivity of $Sr_{0.99}La_{0.01}VO_3$ is 39893 S/cm. The conductivity of $Sr_{0.9}La_{0.1}VO_3$ is 16757 S/cm. The conductivity of $Sr_{0.5}La_{0.5}VO_3$ is 12320 S/cm.

Figure 5:
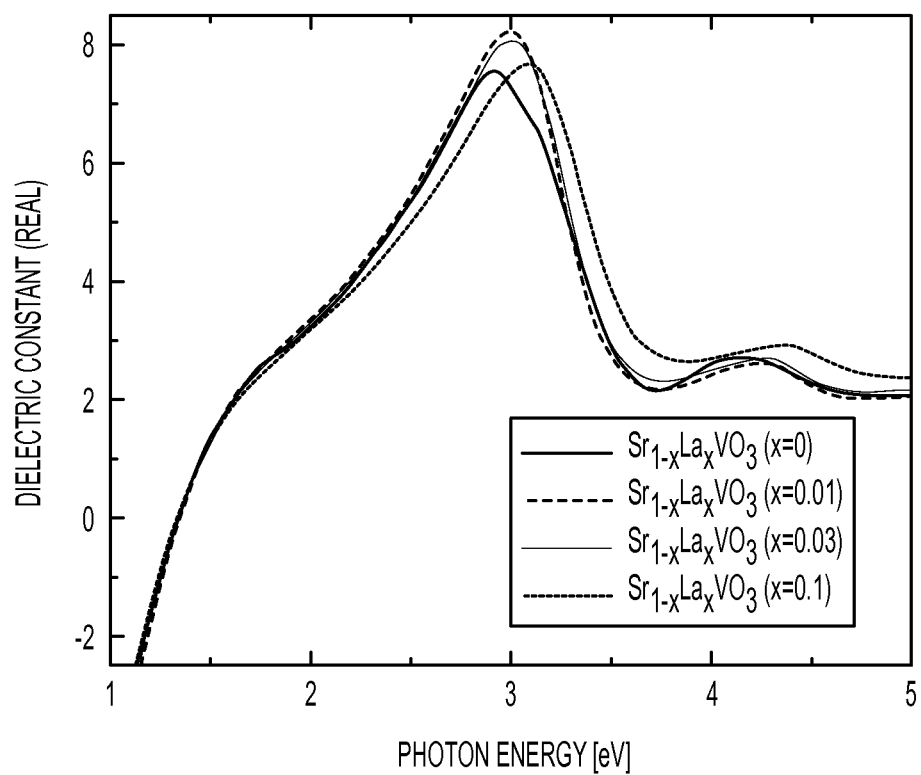
FIG. 5 is a chart of the real part of the dielectric function of $Sr_{1-x}La_xVO_3$ for x=0, 0.01, 0.03 and 0.1.
Figure 6:
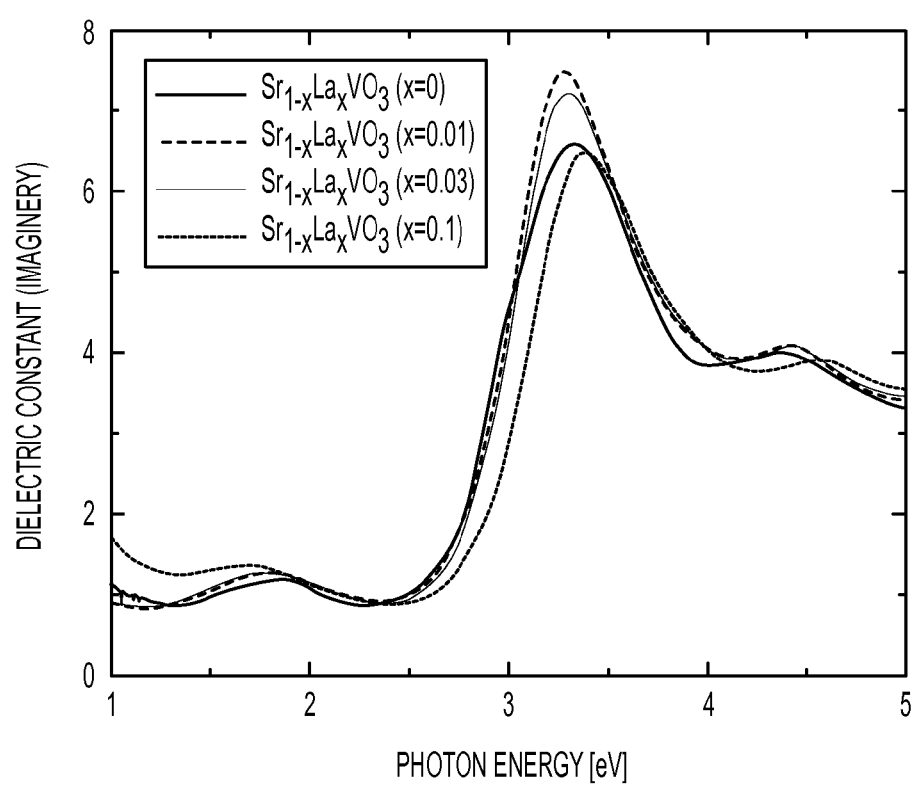
FIG. 6 is a chart of the imagery part of the dielectric function of $Sr_{1-x}La_xVO_3$ for x=0, 0.01, 0.03 and 0.1.

The spectroscopic ellipsometry measurement was carried out at room temperature. The real and imaginary parts of dielectric constant was extracted for films with varying levels of aliovalent substitution were shown in FIGS. 5 and 6.

Figure 7:
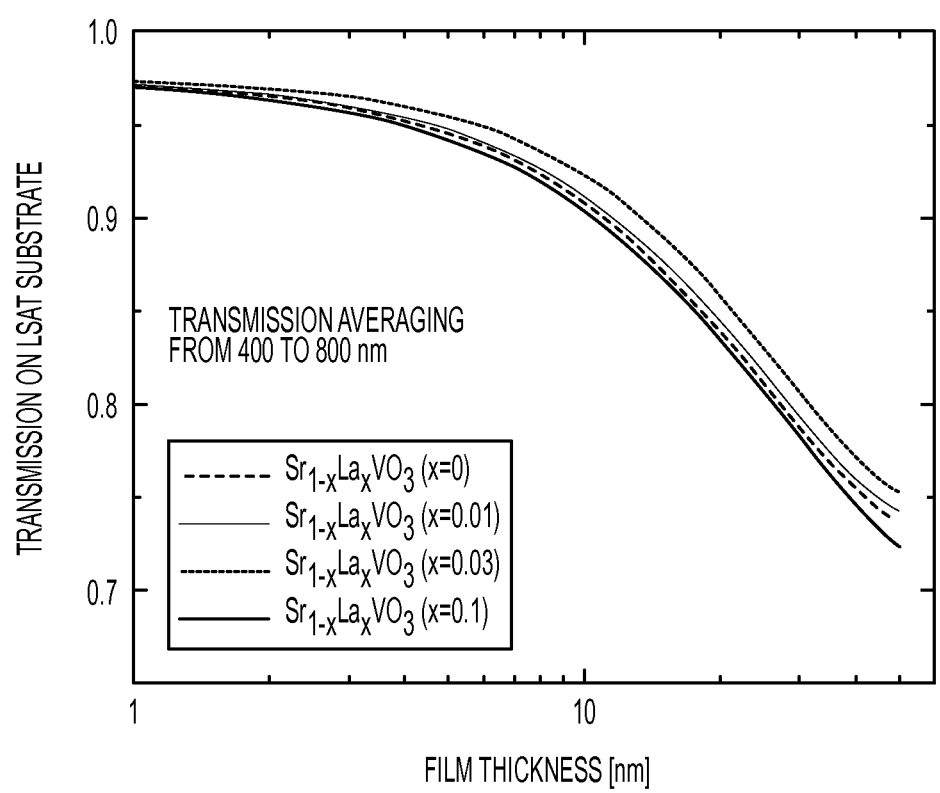
FIG. 7 is a chart of the calculated transmission of $Sr_{1-x}La_xVO_3$ for x=0, 0.01, 0.03 and 0.1, as a function of thickness, averaging from 400 to 800 nm on LSAT $((LaAlO_3)_{0.3} (Sr_2AlTaO_6)_{0.7})$.

The average transmission of a free-standing film from 400 to 800 nm as a function of film thickness was calculated based on the parameter acquired from spectroscopic ellipsometry measurement. The calculated transmission of a free-standing film, which reflects the sole information from the film materials and excludes the substrate inference, is also compared with the real measurement (the transmission of the film divided by the transmission of the substrate, as shown by solid circles) in FIG. 7. The film of $Sr_{0.97}La_{0.03}VO_3$ has the highest transmission among all films studied.

Figure 8:
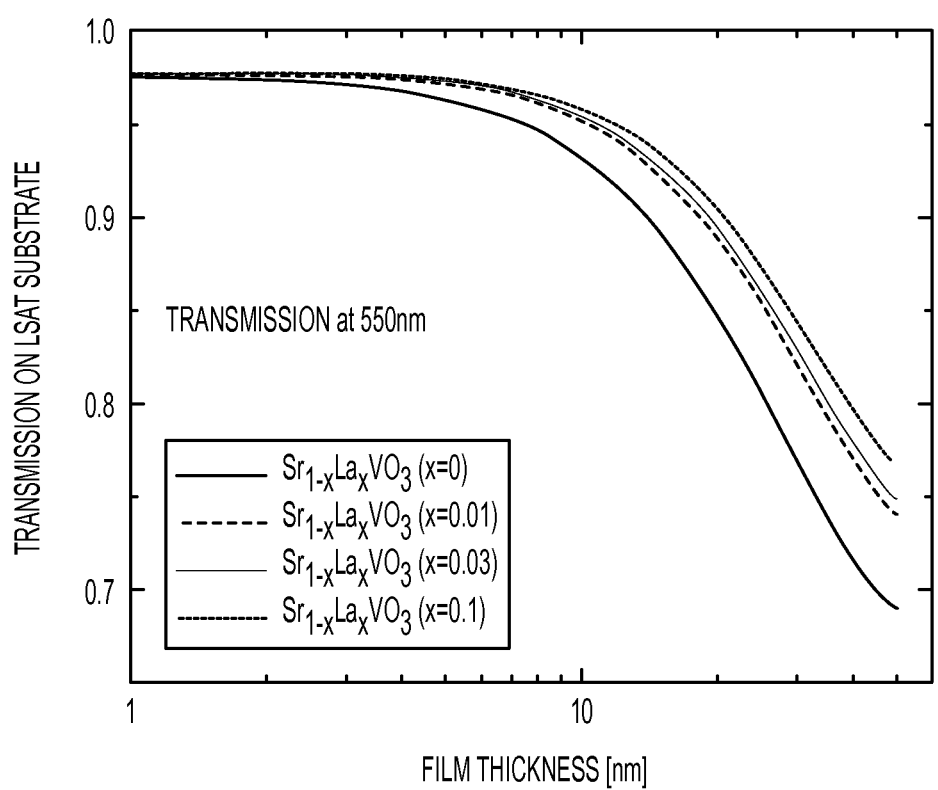
FIG. 8 is a chart of the calculated transmission of $Sr_{1-x}La_xVO_3$ for x=0, 0.01, 0.03 and 0.1, as a function of thickness, at 550 nm on LSAT $((LaAlO_3)_{0.3} (Sr_2AlTaO_6)_{0.7})$ substrate.

The transmission of a free-standing film at 550 nm as a function of film thickness was calculated based on the parameter acquired from spectroscopic ellipsometry measurement and shown in FIG. 8. The film of $Sr_{0.97}La_{0.03}VO_3$ has the highest transmission.

Aliovalent substitution for x=0.03 enhances both, electrical conductivity and optical transtmittance.

While the claimed invention has been described in detail and with reference to specific embodiments thereof, it will be apparent to one of ordinary skill in the art that various changes and modifications can be made to the claimed invention without departing from the spirit and scope thereof. Thus, for example, those skilled in the art will recognize, or be able to ascertain, using no more than routine experimentation, numerous equivalents to the specific substances and procedures described herein. Such equivalents are considered to be within the scope of this invention, and are covered by the following claims.

What is claimed is:

1. A transparent conducting film having a transmittance of about 80% or more at a wavelength of 550 nm comprising a transition metal oxide of formula:

wherein A and A' are different from each other and A represents one or more divalent alkaline earth cations; A' represents either one or more trivalent cations or one or more monovalent cations; B and B' are different from each other and B represents a transition metal selected from group VB; d is a value between −0.5≤d≤0.5; and the values for x and y are 0≤x≤1, 0≤y≤1; and wherein B' is present and represents one or more group VIB transition metal elements to adjust a Fermi level position in a conduction band of the transition metal oxide.

2. The film according to claim 1, wherein A' is present and represents one or more of a trivalent cation of lanthanum, cerium, praseodymium, neodymium, promethium, samarium, europium, gadolinium, terbium, dysprosium, holmium, erbium, thulium, ytterbium, or lutetium to adjust a Fermi level position in a conduction band of the transition metal oxide.

3. The film according to claim 1, wherein A' is present and represents one or more of a monovalent ion of lithium, sodium, potassium, rubidium or cesium to adjust a Fermi level position in a conduction band of the transition metal oxide.

4. The film according to claim 1 characterized by an electron mobility of about 1~100 $cm^2$/V/sec and/or a carrier density of about $1\times10^{21}$~$2\times10^{23}$ $cm^{-3}$, and/or a thickness in the range of about 5 to 50 nm.

5. An electrode material comprising at least one transparent conducting film according to claim 1.

6. An electrode comprising the electrode material of claim 5 on a substrate.

7. The electrode according to claim 6, wherein the substrate is silicon, germanium, or a compound semiconductor with zinc blende or wurtzite crystal structure, with or without a thin transparent coating.

8. The electrode according to claim 6, wherein the substrate is a glass substrate, a plastic substrate, or an oxide deposited substrate, and has transmittance.

9. The film according to claim 1 having a conductivity of about 2000 S/cm (resistivity $5\times10^{-4}$ Ω×cm) to about 100000 S/cm (resistivity $1\times10^{-6}$ Ω×cm) at room temperature.

10. The film according to claim 1, wherein A represents one or more of Mg, Ca, Sr, or Ba; A' represents one or more of La, Nd, Gd, Dy, or another rare earth element; B represents one or more of V, Nb, or Ta, B' represents one or more of Cr, Mo or W.

11. The film according to claim 10, wherein 0.8≤y≤1.0 and 0<x≤0.2.

12. The film according to claim 1, wherein A' and B' are present, A' represents La, or another rare earth element; A represents one or more of Mg, Ca, Sr, or Ba; B represents one or more of V or Nb; B' represents one or more of Mo or W.

13. A transparent conducting film comprising a transition metal oxide of formula:

$$(ABO_{3-d})m(A'B'O_{3-d'})n \qquad (II)$$

wherein A and A' are different from each other and A represents one or more divalent alkaline earth cations; A' represents either one or more trivalent cations or one or more monovalent cations; B and B' are different from each other and B represents a transition metal selected from group VB; and B' represents a transition metal from the groups VB, IVB, VIB, IVA and/or group IIIA; d and d' have values of −0.5≤d≤0.5 and −0.5≤d'≤0.5, respectively, and 1≤m≤10 and 1≤n≤10; and wherein the film has a transmittance of about 80% or more at a wavelength of 550 nm and a conductivity of about 2000 S/cm (resistivity $5\times10^{-4}$ Ω×cm) to about 100,000 S/cm (resistivity $1\times10^{-6}$ Ω×cm) at room temperature.

14. The film according to claim 13, wherein d and/or d' are within the limits of −0.2≤d≤0.2 and −0.2≤d'≤0.2.

15. The film according to claim 13, wherein B' represents one or more group VIB transition metal elements to adjust a Fermi level position in a conduction band of the transition metal oxide.

16. The film according to claim 13, wherein A and A' represent one or more of Sr or Ca; B represents one or more of V or Nb; B' represents one or more of V, Nb, Ta, or Mo.

* * * * *